(12) United States Patent
Henderson et al.

(10) Patent No.: US 8,705,307 B2
(45) Date of Patent: Apr. 22, 2014

(54) MEMORY SYSTEM WITH DYNAMIC REFRESHING

(75) Inventors: Joab D. Henderson, Pflugerville, TX (US); Hillery C. Hunter, Chappaqua, NY (US); Warren E. Maule, Cedar Park, TX (US); Jeffrey A. Stuecheli, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 13/298,587

(22) Filed: Nov. 17, 2011

(65) Prior Publication Data

US 2013/0128682 A1    May 23, 2013

(51) Int. Cl.
*G11C 7/00* (2006.01)
(52) U.S. Cl.
USPC .......................................... 365/222; 365/193
(58) Field of Classification Search
USPC .................................................. 365/222, 193
See application file for complete search history.

(56) References Cited

U.S. PATENT DOCUMENTS

| | | | |
|---|---|---|---|
| 5,594,698 A | 1/1997 | Freeman | |
| 6,963,516 B2 | 11/2005 | Blackmon et al. | |
| 7,142,475 B2 * | 11/2006 | Tsern et al. | 365/222 |
| 7,221,609 B1 * | 5/2007 | Bains | 365/222 |
| 2003/0206478 A1 | 11/2003 | Ayukawa et al. | |
| 2008/0109597 A1 | 5/2008 | Schakel et al. | |

OTHER PUBLICATIONS

Anonymous, "Method for Achieving Optimum Throughput When Using Reduced Latency DRAM as a Packet Buffer"; IP.COM/IPCOM000142959D; Nov. 9, 2006.
Blanco, et al.; "Dynamic Random Access Memory Refresh Method In Triple-Modular-Redundant System"; IP.COM/IPCOM000105234D; IBM TDB, v36, n7; pp. 7-12; Jul. 1, 1993.

\* cited by examiner

*Primary Examiner* — Son Dinh
(74) *Attorney, Agent, or Firm* — Cantor Colburn LLP

(57) ABSTRACT

An embodiment provided is a memory system with dynamic refreshing that includes a memory device with memory cells. The system also includes a refresh module in communication with the memory device and with a memory controller, the refresh module configured for receiving a refresh command from the memory controller and for refreshing a number of the memory cells in the memory device in response to receiving the refresh command. The number of memory cells refreshed in response to receiving the refresh command is responsive to at least one of a desired bandwidth characteristic and a desired latency characteristic.

20 Claims, 4 Drawing Sheets

MEMORY SYSTEM WITH DYNAMIC REFRESHING

BACKGROUND

The present invention relates to memory systems, and more specifically, to a memory system with dynamic refreshing.

As processor speeds continue to increase, memory performance becomes more of a limiting factor in system performance and therefore, memory performance must increase as well. An important aspect of increasing memory performance is increasing the throughput of memory systems. Some memory devices, such as direct random access memory (DRAM) devices require periodic refreshing of their memory cells to prevent data loss. In order to perform a refresh, a memory device enters a refresh mode where the DRAM is not accessible until the refresh has completed execution.

Memory controllers issue refresh commands on a periodic basis so that all memory cells in a DRAM device are refreshed at least once in every predetermined refresh period. The length of the refresh period is dictated by the memory device specifications, with a typical DRAM memory cell requiring a refresh every sixty four milliseconds (64 ms). The number of memory cells refreshed in a single refresh operation is typically fixed and determined by both the total number of cells in the memory device and the total number of refresh commands issued in each refresh period (referred to as a refresh interval). For example, a memory device having eight thousand bits (8 Kbits) and a refresh period of 64 ms may have a refresh interval of 7.8 microseconds (μs) and will refresh one bit during a single refresh cycle (64 ms/8192 bits=7.8 μs). The number of refreshed cells per refresh cycle increases proportionally to the device density. For example, in a one gigabit (1 Gbit) memory device having a refresh period of 64 ms and a refresh interval of 7.8 μs, 128 Kbits are refreshed in one refresh cycle. For a 2 Gbit memory device, having a refresh period of 64 ms and a refresh interval of 7.8 μs, 256 Kbits are refreshed in one refresh cycle (twice as many as during a refresh interval in a 1 Gbit memory device).

The DRAM is not accessible when it is executing the refresh command because typically the memory banks are refreshed at the same time, therefore no memory bank is available for normal access during the refresh period. The memory controller waits until the internal refresh operation has completed before resuming normal operation (e.g., before sending another command such as a read or write command). This period of time when the DRAM is not accessible is referred to as lockout time. Thus, as memory devices increase in size, the amount of time that the memory is locked out or inaccessible increases, affecting system performance.

SUMMARY

An embodiment provided is a memory system that includes a memory device with memory cells. The system also includes a refresh module in communication with the memory device and with a memory controller, the refresh module configured for receiving a refresh command from the memory controller and for refreshing a number of the memory cells in the memory device in response to receiving the refresh command. The number of memory cells refreshed in response to receiving the refresh command is responsive to at least one of a desired bandwidth characteristic and a desired latency characteristic Another embodiment provided is a method for refreshing a memory device that includes determining at least one of a desired bandwidth characteristic and desired latency characteristic for the memory device, and determining a number of memory cells in the memory device to refresh responsive to the determined at least one of the desired bandwidth characteristic and the desired latency characteristic. The method further includes determining a time interval for refreshing the number of memory cells in the memory device responsive to the determined at least one of the desired bandwidth characteristic and the desired latency characteristic and communicating a refresh command to the memory device including the number of memory cells in the memory device to refresh.

A further embodiment provides a computer program product for refreshing a memory device that includes a tangible storage medium readable by a processing circuit and storing instructions for execution by the processing circuit for performing a method. The method performed includes determining at least one of a desired bandwidth characteristic and desired latency characteristic for the memory device, determining a number of memory cells in the memory device to refresh responsive to the determined at least one of the desired bandwidth characteristic and the desired latency characteristic, and determining a time interval for refreshing the number of memory cells in the memory device responsive to the determined at least one of the desired bandwidth characteristic and the desired latency characteristic. The method also includes communicating a refresh command to the memory device including the number of memory cells in the memory device to refresh.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
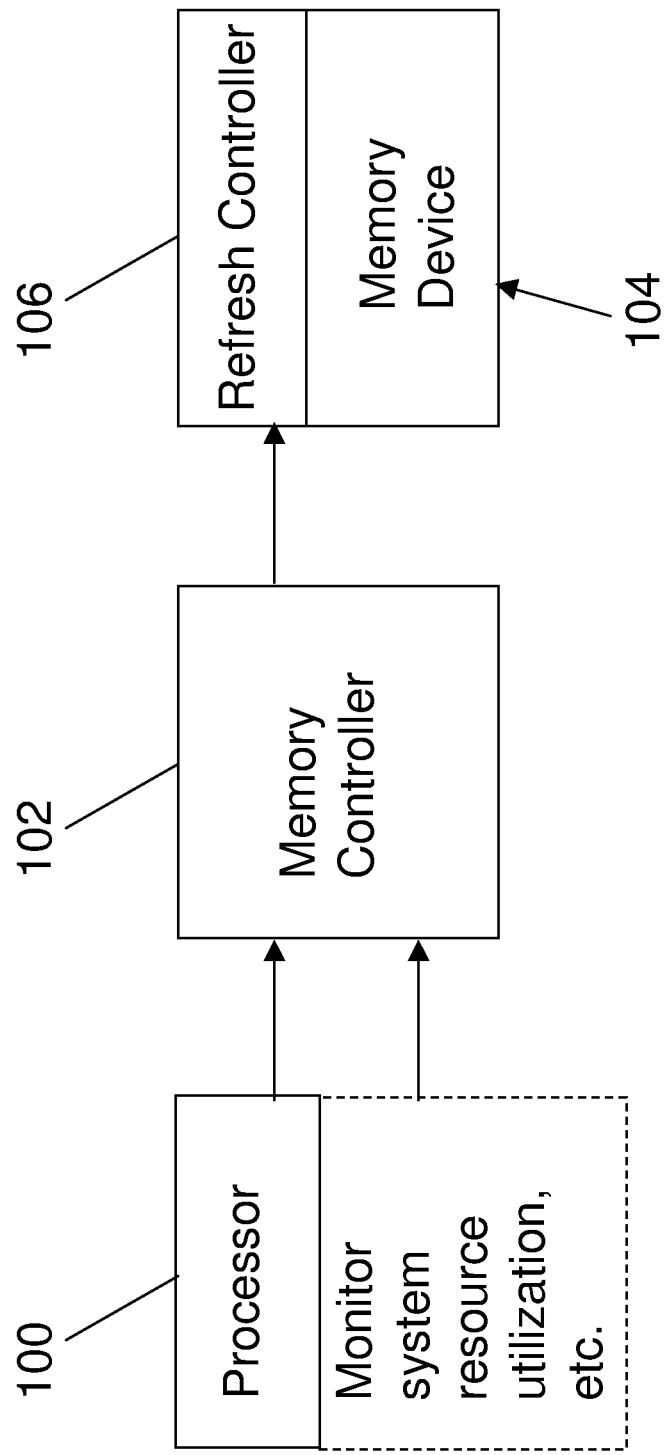
FIG. 1 depicts a high-level block diagram of an computer system that utilizes the dynamic refresh operation in accordance with an embodiment.

An embodiment provides the ability for a memory device, such as a direct random access memory (DRAM) device, to implement a dynamic refresh operation responsive to selected information. The information affecting the refresh operation may include a desired bandwidth characteristic, a desired latency characteristic, system resource utilization, system hardware constraints, and software operations. The dynamic refresh of a memory device allows the memory device to be refreshed in larger or smaller blocks of memory (or memory cells), where the amount of memory cells to be refreshed is dynamically determined to reduce the impact of refreshing on system performance. For example, if the operation determines that there is currently high bandwidth utilization in the memory system and/or the system's workload is not latency sensitive, the depicted system and method provide a refresh command to refresh a larger number of memory cells where there is a longer interval between refreshes (i.e., lower frequency for refresh commands). If the operation determines that there is low bandwidth utilization in the system and/or the system is more sensitive to latency, the system and method provide a refresh command to refresh a smaller number of memory cells, where the refresh commands occur at shorter intervals (i.e., higher frequency). The dynamic refresh operation determines the amount of memory cells and interval between commands based on selected information to improve system memory performance.

As used herein, the term "refresh period" refers to the maximum amount of time that can pass between refreshes on a memory cell in order for the memory cell to retain its value. The length of the refresh period is dictated by the memory device specifications and exemplary contemporary DRAM memory devices specify a refresh every 64 milliseconds (ms).

As used herein, the term "average refresh cycle interval" (also referred to as "tREFI" or "interval") refers to how often the memory controller issues refresh commands to the memory device. In embodiments described herein, the tREFI is selectable. In an aspect, a shorter interval or tREFI corresponds to a lower latency for system memory performance. Similarly, a longer interval corresponds to a higher latency. In an embodiment, a 512 Mb DDR2 memory device has a tREFI of about 7.81 µS.

As used herein, the terms "minimum refresh cycle time" and "lock out time", used interchangeably and abbreviated as "tRFC", refer to the period of time when a refresh command is executing and the DRAM is not accessible. In an example, the tRFC is equal to the delay required between two back-to-back refresh commands. As used herein, the term "total lockout time" or "total tRFC" refers to the total amount of time during each refresh period that the memory device is not available for normal operation due to refresh command processing.

When a smaller number of cells are refreshed in each tREFI, the tRFC is shorter. However, refreshing "N/2" memory cells requires slightly more than half the amount of time required to refresh "N" memory cells. This is because a constant amount of time is added to each refresh operation due to overhead associated with refresh commands (e.g., sense amplifier time and address decode time). In an embodiment, this constant amount of time is equal to sixty nano seconds (60 ns), and the tRFC is equal to 60 ns+the number of cells being refreshed (in Gbits) multiplied by 50 ns (tRFC=60 ns+density in Gbits*50 ns). The total lockout time in each refresh period is equal to tRFC×the number of refresh commands issued within the refresh period. Thus, there exists some optimum point for tRFC where the memory bandwidth can be maximized. However, this optimum point may be a function of DRAM device density and memory configuration (number of ranks, number of channels and ports, etc.).

The term DRAM is used herein when describing embodiments. It will be appreciated that any memory device that requires periodic refreshing of memory cells to retain stored values may benefit from embodiments described herein. Thus, embodiments described herein are not limited to DRAM devices and embodiments include any memory device using a dynamic refresh operation.

FIG. 1 illustrates a high-level block diagram of an exemplary computer system that utilizes the dynamic refresh operation. The computer includes one or more processors, such as processor 100. Processor 100 is coupled by a memory controller 102 to a memory device 104. Memory device 104 (also referred to as "memory") can be any level of cache or memory, and implemented, for example, by a direct random access memory (DRAM) device. The exemplary memory device 104 includes a refresh controller 106 (also referred to as a "refresh module") configured to receive refresh commands and provide a refresh for a selected number of memory cells in the memory device 104. The memory controller 102 communicates commands to the refresh controller 106 to control refresh operations of the memory device 104. In embodiments, the refresh controller 106 may be a separate module, part of the memory controller 102, part of the memory device 104 or any combination thereof. In an embodiment, the memory device 104 is a single memory chip, wherein the dynamic refresh operations are configured to refresh a selected number of memory cells within the memory chip.

The processor 100 may host and run a computer program to monitor and/or determine various system parameters, such as resource utilization, desired performance characteristics, current bandwidth utilization, application information and other system parameters. In an embodiment where the computer system is performing in a real-time or deterministic application (i.e., "application information"), the processor has a program determine a desired characteristic for memory performance. For example, the program determines a desired latency characteristic for a read or write of the memory device 104, where real time application is latency sensitive. Thus, more bandwidth is available for the bandwidth sensitive application. Accordingly, the latency sensitive application leads to short-duration refresh operation with a lower number of cells refreshed to reduce lock out time. Further, the interval between initiations of refresh operations is also shorter, leading to a higher refresh "frequency."

In another example, a bandwidth (also referred to as "overhead") sensitive application (i.e., "application information") causes the program to determine a desired bandwidth characteristic that provides low bandwidth utilization during refresh of the memory device 104. Thus, a higher number of cells, relative to the latency sensitive application, are refreshed by a refresh command from the memory controller 102, wherein the higher number of memory cells reduces bandwidth usage, relative to the latency sensitive application. Accordingly, a longer duration refresh operation occurs that may result in higher latency for memory accesses."

For example, a refresh command may have a completion time ("tRFC") based on two components of the operation and corresponding time for each component to be performed. A first component is the fixed amount time for overhead required to perform a refresh command. The amount of time to perform overhead operations is fixed and independent of the size of memory being refreshed. A second component of the completion time is the time for the actual refresh of the specified number of memory cells. The actual refresh time varies in length depending on the selected number of cells. As depicted in FIG. 1, the processor 100, memory controller 102 and/or refresh controller 106 dynamically adjust and determine the refresh command completion time based on desired system performance characteristics, such as a desired latency or bandwidth. Accordingly, the number of memory cells, corresponding to the actual refresh time component, is dynamically adjusted to alter the command completion time. For example, a fixed overhead amount of time is equal to 50 nano seconds (50 ns) and the actual refresh time is equal to N multiplied by 50 ns, where N equals the number of 512 Mb memory blocks being refreshed (wherein each 512 Mb block requires 50 ns to refresh). Thus, tRFC=50 ns+N×50 ns.

Accordingly, in an example, for a large refresh operation with higher latency and lower bandwidth, such as an 8 Gb (where N=16) memory block, the fixed overhead of 50 ns is spread out or amortized over the 8 Gb memory block, wherein tRFC=850 ns. Further, for a lower latency and higher bandwidth refresh operation, such as a 1 Gb (N=2) memory block, the fixed overhead of 50 ns is added to the actual refresh time of 100 ns to produce a tRFC=150 ns. Therefore, the shorter refresh operation has a reduced completion or "lockout" time to reduce the latency penalty as compared to the larger refresh operation. Thus, would be desirable for a latency sensitive memory operation characteristic. Accordingly, in the example, the larger refresh operation has an overhead that uses less than 6% of the completion time, wherein the smaller refresh operation has an overhead that uses about 33% of the completion time. In an embodiment, the dynamic refresh system and method enables a reduced time for the shorter refresh operation (tRFC) to reduce a latency "penalty" for a system performing latency sensitive operations (the desired characteristic). The system and method also provides a larger refresh operation, with an increased latency, for a system performing bandwidth intensive operations (the desired characteristic).

Figure 2:
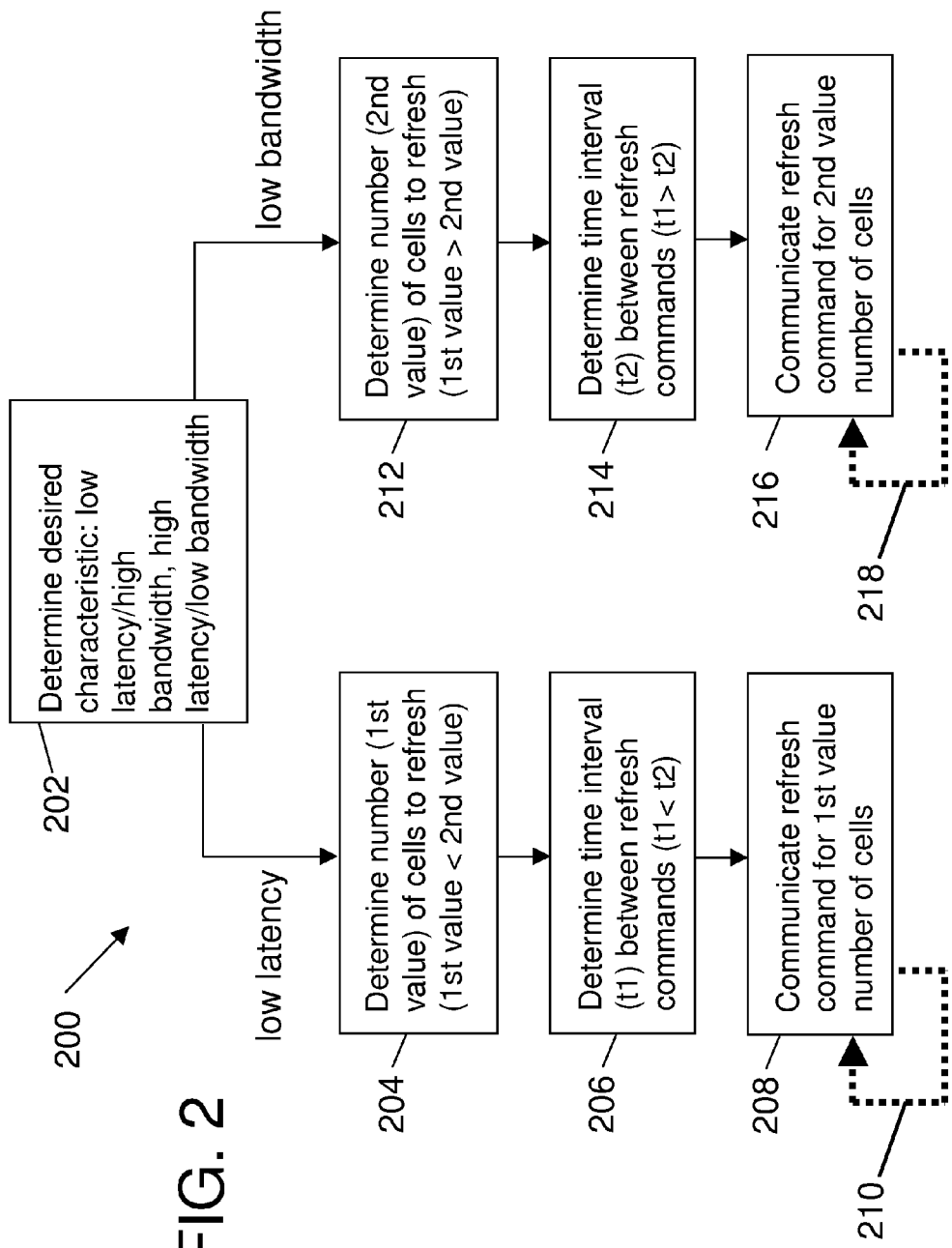
FIG. 2 depicts a block diagram of a process used to refresh a memory device in accordance with an embodiment.

FIG. 2 depicts a block diagram 200 of a process, in accordance with an exemplary embodiment, that is used to refresh a memory device, such as memory device 104. At block 202 at least one desired performance characteristic is determined, where the exemplary characteristic may be a bandwidth or latency characteristic. In an embodiment, a desired low latency can lead to higher bandwidth utilization for the memory device. Further, a desired low bandwidth can lead to higher latency for the memory device. In an embodiment, the determined performance characteristic is determined by a program wherein the program determines that a system condition requires low latency or low bandwidth usage. Exemplary system conditions include, but are not limited to, real-time applications (latency sensitive), memory device density, latency critical tasks, bandwidth critical (sensitive) tasks and scheduled memory read or write tasks. In addition, current system conditions may also be used to determine the desired latency or bandwidth characteristic. For example, if the system determines that over half the available bandwidth is currently being used, block 202 may determine that a low bandwidth and high latency refresh operation is to be performed. In another example, if the system determines that substantially all (greater than 90%) of the system bandwidth is available, then block 202 determines that a low latency and high bandwidth refresh operation is to be performed. In embodiments, the system also utilizes historical bandwidth usage data to determine desired latency or desired bandwidth characteristics. In one embodiment, the lockout time or tRFC of a refresh operation is provided in the memory specification provided by the manufacturer, wherein the tRFC is a factor used to determine the desired number of cells to refresh.

In block 204, if a low latency refresh is determined, the number of cells (e.g., rows) to be refreshed is determined, wherein the low latency number of cells corresponds to a first value. Alternatively in block 212, if a low bandwidth refresh is determined, the number of cells to be refreshed is determined, wherein the low bandwidth number of cells corresponds to a second value, wherein the second value is greater than the first value. In block 206, the time interval, represented by "t1", between refresh commands is determined. In block 214, the time interval, represented by "t2", between refresh commands is determined. In an embodiment, the low latency t1 interval is less than the low bandwidth t2 interval.

In blocks 208 and 210, a refresh command for refreshing the selected number of cells (first value or second value) is communicated to the memory device 104. In an embodiment, the refresh command may be repeated, as shown by loops 210 and 218, at the selected intervals, t1 or t2, to refresh the entire memory device 104. As depicted, the number of cells refreshed at a time varies and is determined dynamically, wherein the dynamic determination of the number of cells to be refreshed in the memory device 104 is based on several factors. The factors may include desired latency or bandwidth characteristics, which may also be determined dynamically based on system resources and application information.

Figure 3:
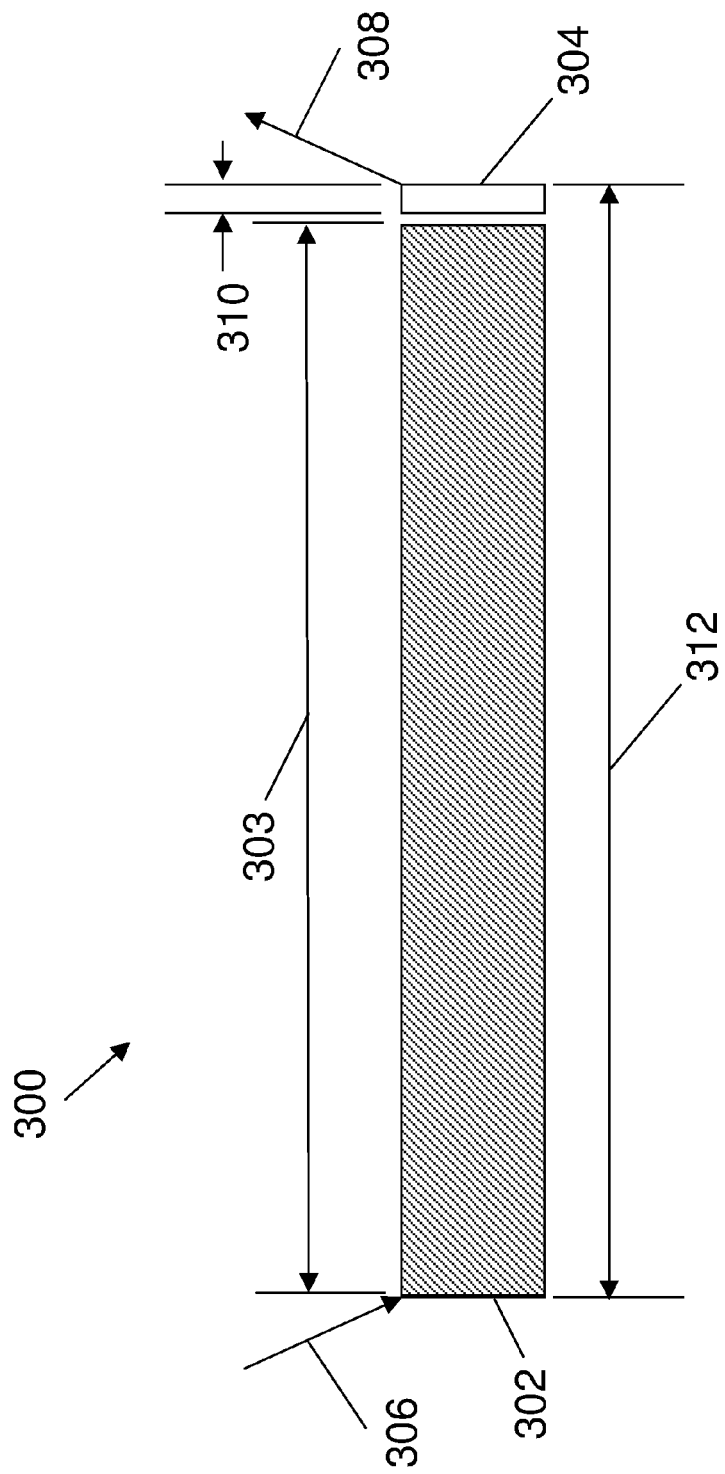
FIG. 3 depicts a chart illustrating a timeline for a memory device operation in accordance with an embodiment.
Figure 4:
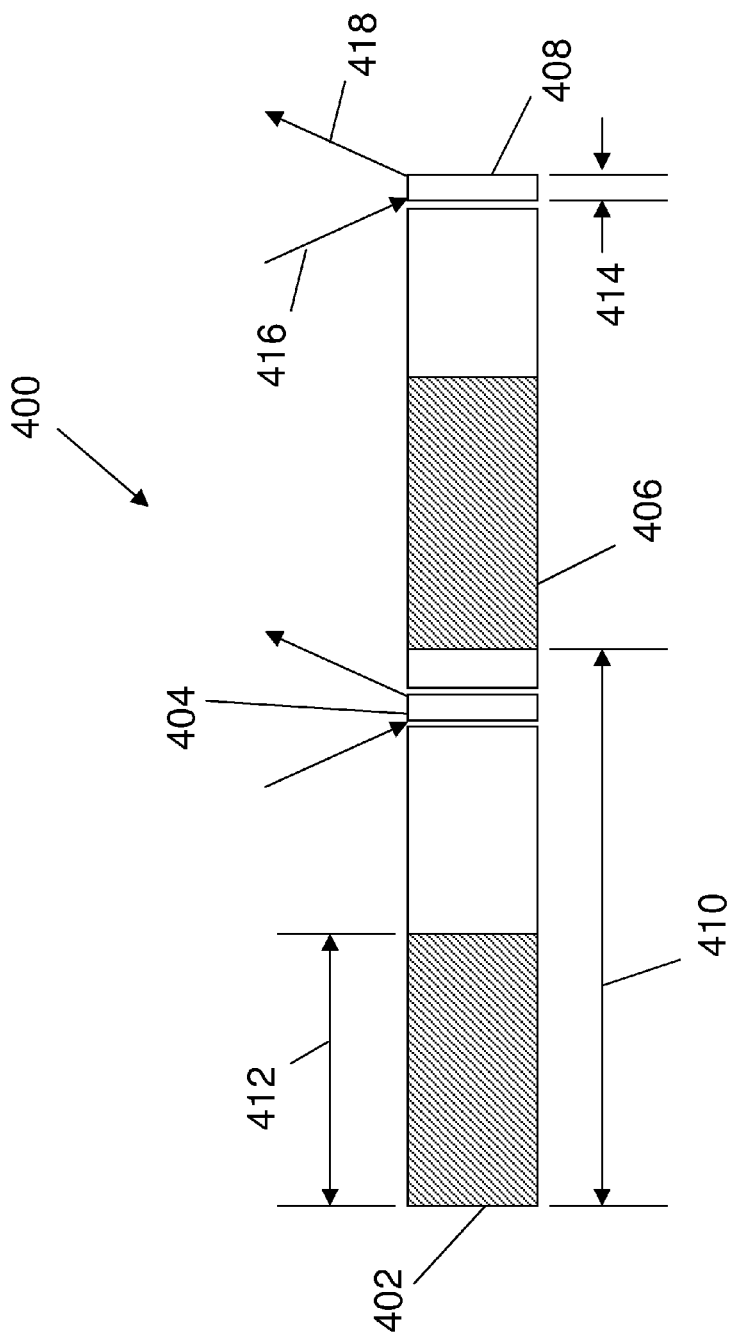
FIG. 4 depicts a chart illustrating a timeline for a memory device operation in accordance with an embodiment.

FIGS. 3 and 4 are charts illustrating timelines for exemplary memory device operations. FIG. 3 shows a chart 300 of a timeline for an exemplary low bandwidth memory device operation. A refresh command 302 is shown wherein the refresh cycle time (tRFC or lockout time) 303 is longer due to a large number of memory cells being refreshed (relative to chart 400 discussed below). A command 304, such as a read or write command, is initiated as shown by element 306, where the command has to wait for the entire refresh over a time 303 to be completed, as shown by element 308. A time 310 shows the time actually needed to perform only the command 304 itself with no delays, where an elapsed time 312 shows the actual time to perform the command in the exemplary system, including the delay caused by the refresh command 302. The exemplary chart 300 illustrates a low bandwidth refresh that can result in higher latency, as shown by the elapsed time 312 for the read or write command 304.

FIG. 4 shows a chart 400 of a timeline for an exemplary low latency memory device operation. Refresh commands 402 and 406 have shorter refresh cycle times (e.g., cycle time 412 for command 402) due to less number of memory cells being refreshed in a single command (relative to chart 300 discussed above). An interval 410 is the time between the initiation of refresh commands 402 and 406. Commands 404 and 408, such as read or write commands, are performed with substantially no delay, thereby meeting the desired low latency desired characteristic. For example, an elapsed time 414 represents the time from initiation 416 to completion 418 of command 408.

Technical effects and benefits include the ability to dynamically determine an amount of memory cells to refresh based on various information, which may lead to improved memory performance by reducing latency or bandwidth characteristics affected by refresh commands.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:
1. A system comprising:
a memory device comprising memory cells; and
a refresh module in communication with the memory device and with a memory controller, the refresh module configured for receiving a refresh command from the memory controller and for refreshing a number of the memory cells in the memory device in response to receiving the refresh command, the number of memory cells refreshed in response to receiving the refresh command based on a desired latency characteristic, wherein the number of memory cells refreshed in response to receiving the refresh command comprises a first value when the desired latency characteristic includes a low latency and the number of memory cells comprises a second value when the desired bandwidth characteristic includes a low bandwidth utilization, wherein the first value is less than the second value.

2. The system of claim 1, wherein a frequency of the memory controller communicating the refresh command to the refresh module is responsive to at least one of a desired bandwidth characteristic and the desired latency characteristic.

3. The system of claim 1, wherein the refresh module comprises a refresh controller.

4. The system of claim 1, wherein the number of memory cells refreshed in response to receiving the refresh command is further based on a desired bandwidth characteristic.

5. The system of claim 4, wherein the desired bandwidth characteristic is based on a determined bandwidth utilization.

6. The system of claim 4, wherein the desired bandwidth characteristic comprises bandwidth available based on current system bandwidth usage.

7. The system of claim 1, wherein the memory device is a dynamic random access memory (DRAM) device.

8. The system of claim 1, wherein the desired latency characteristic is based on application information.

9. A method for refreshing a memory device, the method comprising:
   determining at least one of a desired bandwidth characteristic and a desired latency characteristic for the memory device;
   determining a number of memory cells in the memory device to refresh responsive to the determined at least one of the desired bandwidth characteristic and the desired latency characteristic;
   determining a time interval for refreshing the number of memory cells in the memory device responsive to the determined at least one of the desired bandwidth characteristic and the desired latency characteristic; and
   communicating a refresh command to the memory device including the number of memory cells in the memory device to refresh.

10. The method of claim 9, further comprising transmitting a subsequent refresh command after the time interval.

11. The method of claim 9, wherein determining the number of memory cells in the memory device to refresh comprises determining a first value when the desired latency characteristic includes low latency and the number of memory cells comprise a second value when the desired bandwidth characteristic includes low bandwidth usage, wherein the first value is less than the second value.

12. The method of claim 11, wherein determining the time interval for refreshing the number of memory cells in the memory device comprises determining a first time interval when the desired latency characteristic includes a low latency and determining a second time interval when the desired bandwidth characteristic includes a low bandwidth usage, wherein the first time interval is less than the second time interval.

13. The method of claim 9, wherein the desired bandwidth characteristics comprise bandwidth available based on current system bandwidth usage.

14. The method of claim 9, wherein the at least one of the desired bandwidth characteristic and the desired latency characteristic are based on application information.

15. A computer program product for refreshing a memory device, the computer program product comprising:
   a tangible storage medium readable by a processing circuit and storing instructions for execution by the processing circuit for performing a method comprising:
      determining at least one of a desired bandwidth characteristic and a desired latency characteristic for the memory device;
      determining a number of memory cells in the memory device to refresh responsive to the determined at least one of the desired bandwidth characteristic and the desired latency characteristic;
      determining a time interval for refreshing the number of memory cells in the memory device responsive to the determined at least one of the desired bandwidth characteristic and the desired latency characteristic; and
      communicating a refresh command to the memory device including the number of memory cells in the memory device to refresh.

16. The computer program product of claim 15, wherein the method further comprises transmitting a subsequent refresh command after the time interval.

17. The computer program product of claim 15, wherein determining the number of memory cells in the memory device to refresh comprises determining a first value when the desired latency characteristic includes low latency and the number of memory cells comprise a second value when the desired bandwidth characteristic includes low bandwidth usage, wherein the first value is less than the second value.

18. The computer program product of claim 17, wherein determining the time interval for refreshing the number of memory cells in the memory device comprises determining a first time interval when the desired latency characteristic includes a low latency and determining a second time interval when the desired bandwidth characteristic includes a low bandwidth usage, wherein the first time interval is less than the second time interval.

19. The computer program product of claim 15, wherein the desired bandwidth characteristics comprise bandwidth available based on current system bandwidth usage.

20. The computer program product of claim 15, wherein the at least one of the desired bandwidth characteristic and the desired latency characteristic are based on application information.

* * * * *